(12) United States Patent
Wang

(10) Patent No.: US 12,487,034 B2
(45) Date of Patent: Dec. 2, 2025

(54) CAPILLARY MESH WOVEN STRUCTURE

(71) Applicant: ASIA VITAL COMPONENTS (CHINA) CO., LTD., Shenzhen (CN)

(72) Inventor: Rong-Yuan Wang, Shenzhen (CN)

(73) Assignee: ASIA VITAL COMPONENTS (CHINA) CO., LTD., Shenzhen (CN)

( * ) Notice: Subject to any disclaimer, the term of this patent is extended or adjusted under 35 U.S.C. 154(b) by 222 days.

(21) Appl. No.: 18/202,296

(22) Filed: May 26, 2023

(65) Prior Publication Data

US 2024/0393058 A1 Nov. 28, 2024

(51) Int. Cl.
*F28D 15/04* (2006.01)

(52) U.S. Cl.
CPC .................... *F28D 15/046* (2013.01)

(58) Field of Classification Search
CPC .............................. F28D 15/046; F28D 15/04
USPC ..................................................... 165/104.26
See application file for complete search history.

(56) References Cited

U.S. PATENT DOCUMENTS

| | | | |
|---|---|---|---|
| 2006/0213646 A1* | 9/2006 | Hsu | F28D 15/046 |
| | | | 165/104.26 |
| 2007/0163755 A1* | 7/2007 | Kim | H01L 23/427 |
| | | | 165/104.21 |
| 2007/0294892 A1* | 12/2007 | Yang | B23P 15/26 |
| | | | 29/890.032 |
| 2007/0295494 A1* | 12/2007 | Mayer | F28D 15/0233 |
| | | | 29/890.032 |
| 2010/0157533 A1* | 6/2010 | Oniki | H05K 7/20336 |
| | | | 29/890.032 |
| 2011/0088877 A1* | 4/2011 | Oniki | H01L 23/427 |
| | | | 29/890.032 |
| 2013/0306279 A1 | 11/2013 | Olson | |

FOREIGN PATENT DOCUMENTS

| | | | | |
|---|---|---|---|---|
| CN | 2784857 Y | * | 5/2006 | ........... F28D 15/046 |
| CN | 102538529 A | * | 7/2012 | ........... F28D 15/046 |
| CN | 113566626 A | * | 10/2021 | |
| CN | 113804033 A | * | 12/2021 | |
| CN | 215321084 U | | 12/2021 | |
| CN | 218159688 U | | 12/2022 | |

(Continued)

OTHER PUBLICATIONS

Translation of CN 113566626A (Year: 2021).*

(Continued)

*Primary Examiner* — Tho V Duong
(74) *Attorney, Agent, or Firm* — Demian K. Jackson; Jackson IPG PLLC

(57) ABSTRACT

A capillary mesh woven structure is applied to a two-phase fluid heat dissipation unit. The capillary mesh woven structure includes multiple longitudinal lines and multiple latitudinal lines. At least two latitudinal lines with different line diameters are selectively arranged as a latitudinal line set. The single longitudinal line and one latitudinal line set sequentially repeatedly intersect (and overlap with) each other and are collocated and woven with each other to form the capillary mesh woven structure. Accordingly, the capillary mesh woven structure has more voids with different sizes so that the capillary mesh woven structure has greater capillary attraction and better water collection (containing) ability to greatly enhance the heat transfer performance.

6 Claims, 6 Drawing Sheets

(56) References Cited

FOREIGN PATENT DOCUMENTS

| | | | |
|---|---|---|---|
| EP | 1083251 A2 | 3/2001 | |
| TW | M272068 U | 8/2005 | |
| TW | M307628 U | 3/2007 | |
| TW | 200800453 A * | 1/2008 | ............ B23P 15/26 |
| TW | 1746010 B | 11/2021 | |
| TW | M634207 U | 11/2022 | |
| TW | 112117005 | 5/2023 | |
| TW | 219861789 U | 10/2023 | |

OTHER PUBLICATIONS

English translation of CN 2784857Y (Year: 2006).*
Search Report dated Jul. 17, 2025, issued by China National Intellectual Property Administration for counterpart application No. 202310516709.6.

* cited by examiner

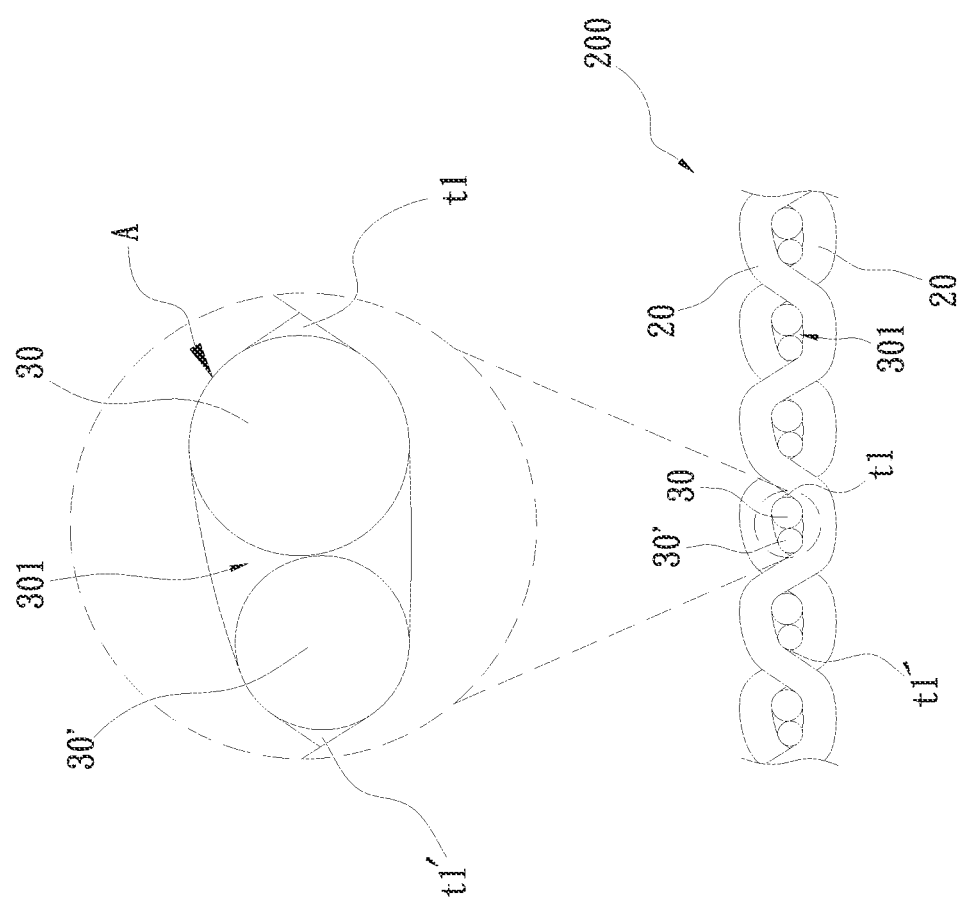

CAPILLARY MESH WOVEN STRUCTURE

BACKGROUND OF THE INVENTION

1. Field of the Invention

The present invention relates generally to a capillary structure, and more particularly to a capillary mesh woven structure. The capillary mesh woven structure has better capillary attraction and water collection (containing) ability to enhance the capillary heat transfer performance.

2. Description of the Related Art

Along with the rapid advance of technologic and scientific industries, currently, many 3C electronic products are designed with lightweight, thin, short and small size. Under such circumstance, the heat dissipation unit disposed in the electronic product for dissipating or conducting the heat must be thinned in accordance with the thin electronic product. In this case, the heat dissipation unit employing transformation between two phases of a working fluid, such as a heat pipe or a vapor chamber, has been stressed. However, the heat conductivity of the two-phase fluid heat dissipation unit is mostly determined by the capillary structure.

Please refer to FIG. 5, which shows a flat and thin woven mesh capillary structure applied to an ultra-thin heat pipe. The flat and thin woven mesh capillary structure 5 includes multiple first weaving lines 51 extending in a longitudinal direction and multiple second weaving lines 52 extending a latitudinal direction. The first and second weaving lines 51, 52 repeatedly intersect each other and are woven with each other to form the flat and thin woven mesh capillary structure 5. Each two adjacent first weaving lines 51 and each two second weaving lines 52 together define a mesh. Each weaving line has multiple intersection sections 53 and multiple connection sections 54 serially connected between each two adjacent intersection sections 53. The intersection section 53 of each weaving line has a flat cross section, whereby the woven mesh capillary structure 5 is flattened and thinned.

However, the aforesaid conventional woven mesh capillary structure is simply composed of the first weaving lines 51 and the second weaving lines 52, which repeatedly intersect each other and are woven with each other. The first and second weaving lines 51, 52 have the same diameter (thickness). Therefore, after the first and second weaving lines 51, 52 longitudinally and latitudinally intersect (and overlap with) each other and are woven with each other, multiple voids with the same fixed size are formed in the woven mesh capillary structure. In addition, the number of the voids and the number of the meshes of the woven mesh capillary structure are fixed. As a result, the application of the capillary attraction of the woven mesh capillary structure, (such as the enhancement of the water containing (collection) ability and the transverse water absorption ability of the entire woven mesh capillary structure or a local section of the woven mesh capillary structure), is too monotonous so that the woven mesh capillary structure cannot be flexibly utilized.

Therefore, the conventional woven mesh capillary structure can simply provide a limited number of voids and a limited number of meshes with the same size for absorbing the working fluid. In this case, the conventional woven mesh capillary structure cannot be freely designed in accordance with the type of the two-phase fluid heat dissipation unit to satisfy different heat dissipation requirements of the respective sections of the two-phase fluid heat dissipation unit. Therefore, the water containing ability of the woven mesh capillary structure is insufficient and the capillary attraction of the entire woven mesh capillary structure is poor. As a result, the two-phase fluid heat dissipation unit employing the woven mesh capillary structure cannot be flexibly utilized so that the backflowing is too slow and the water content of the evaporation face of the two-phase fluid heat dissipation unit is insufficient. Consequently, dry-out may take place on the evaporation face to lower the heat transfer performance.

It is therefore tried by the applicant to provide a capillary mesh woven structure, which has better capillary attraction and water containing ability to solve the problems of the conventional woven mesh capillary structure disposed in the heat dissipation unit.

SUMMARY OF THE INVENTION

It is therefore a primary object of the present invention to provide a capillary mesh woven structure including multiple longitudinal lines and multiple latitudinal lines. At least two latitudinal lines with different line diameters are selectively arranged as a latitudinal line set. The single longitudinal line and one latitudinal line set sequentially repeatedly intersect (and overlap with) each other and are collocated and woven with each other to form the capillary mesh woven structure. The number of the longitudinal lines is different from and in a certain proportion to the number of the collocated latitudinal lines. In addition, the line diameter of the longitudinal lines is different from the line diameters of the collocated latitudinal lines. Accordingly, the capillary mesh woven structure has more voids with different sizes so that the capillary mesh woven structure has greater capillary attraction and better water collection (containing) ability to greatly enhance the heat transfer performance.

To achieve the above and other objects, the capillary mesh woven structure of the present invention is applied to and disposed in a two-phase fluid heat dissipation unit. The capillary mesh woven structure includes multiple longitudinal lines and multiple latitudinal lines. At least two latitudinal lines with different line diameters are selectively arranged as a latitudinal line set. The multiple longitudinal lines extend in a first weaving direction, while the multiple latitudinal lines extend in a second weaving direction. The single longitudinal line and one latitudinal line set sequentially repeatedly intersect (and overlap with) each other and are collocated and woven with each other to form the capillary mesh woven structure.

Accordingly, the entire weaving section (area) of the capillary mesh woven structure or a local weaving section (area) of the capillary mesh woven structure of the present invention is woven from the single longitudinal line and one cooperative latitudinal line set (having multiple latitudinal lines with different thicknesses), which sequentially repeatedly intersect and overlap with each other. Therefore, the number of the voids with different sizes of the capillary mesh woven structure is increased to form a dense and firm mesh structure having greater capillary attraction and better water collection (containing) ability to enhance the capillary action. Moreover, the capillary mesh woven structure can effectively directionally quickly guide the working fluid (to flow back) and fully spread the working fluid over the evaporation face of the two-phase fluid heat dissipation unit. Accordingly, the water collection (containing) ability of the evaporation face of the two-phase fluid heat dissipation unit is enhanced to avoid dry-out and promote the heat exchange efficiency.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein:

FIG. 3 is a left side view of the capillary mesh woven structure of the present invention according to FIG. 2A;

DETAILED DESCRIPTION OF THE PREFERRED EMBODIMENTS

Figure 1:
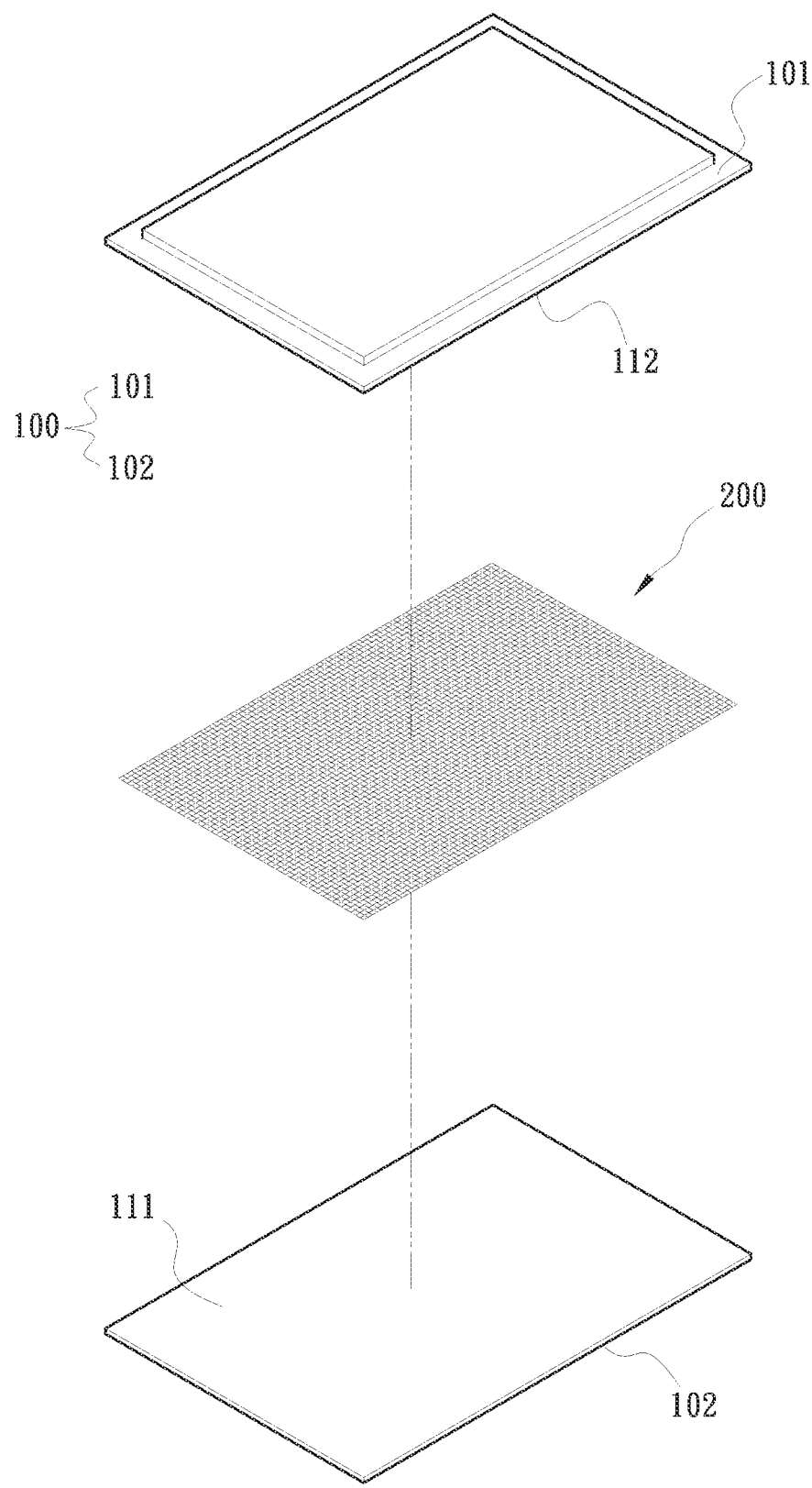
FIG. 1 is a perspective exploded view showing that the capillary mesh woven structure of the present invention is applied to a two-phase fluid heat dissipation unit.
Figure 4:
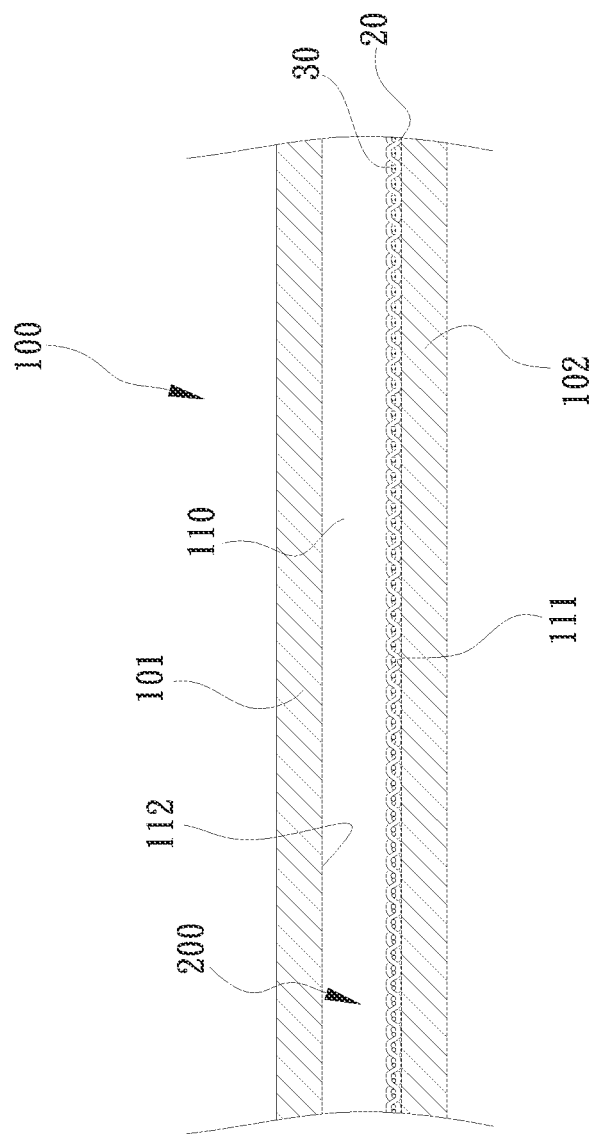
FIG. 4 is a sectional view showing that the capillary mesh woven structure of the present invention is disposed in the two-phase fluid heat dissipation unit.
Figure 5:
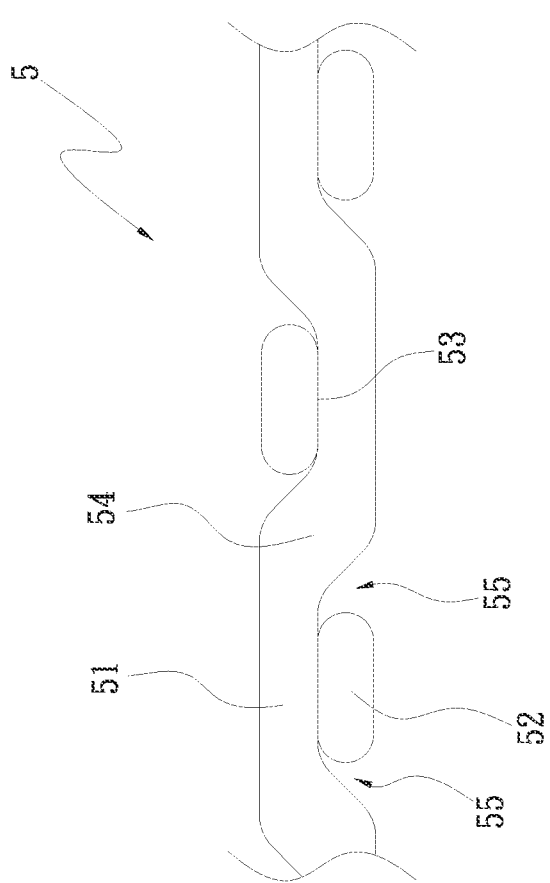
FIG. 5 is a side view of a conventional thinned flat-type woven mesh capillary structure.

Please refer to FIGS. 1, 2A, 2B, 3 and 4, which show the capillary mesh woven structure of the present invention. The capillary mesh woven structure 200 is disposed in a two-phase fluid heat dissipation unit 100 (such as a vapor chamber, a flat-plate heat pipe, a heat pipe, a loop-type heat pipe or any other two-phase fluid device). As shown in FIGS. 1 and 4, the two-phase fluid heat dissipation unit 100 has a case body. In the present invention, a vapor chamber is selected as an example of the two-phase fluid heat dissipation unit 100 for illustration purposes. The case body includes an upper plate 101 and a lower plate 102. The upper plate 101 is mated with the lower plate 102 to together define a chamber 110, in which a working fluid is filled (as shown in FIG. 4). The capillary mesh woven structure 200 is at least selectively disposed on an inner surface of the upper plate 101 and/or the lower plate 102 of the chamber 110.

Figure 2A:
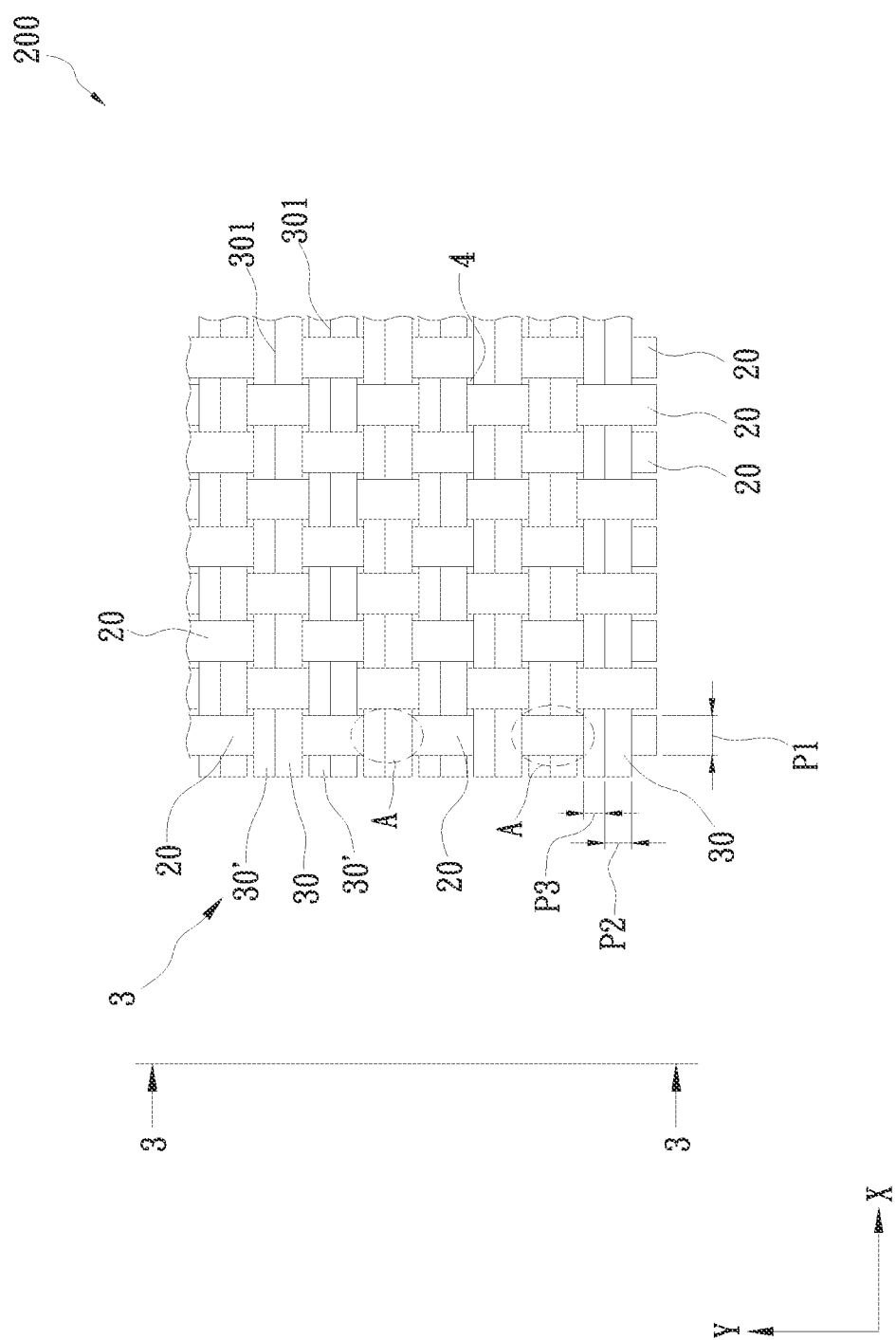
FIG. 2A is a top view of the capillary mesh woven structure of the present invention.
Figure 2B:
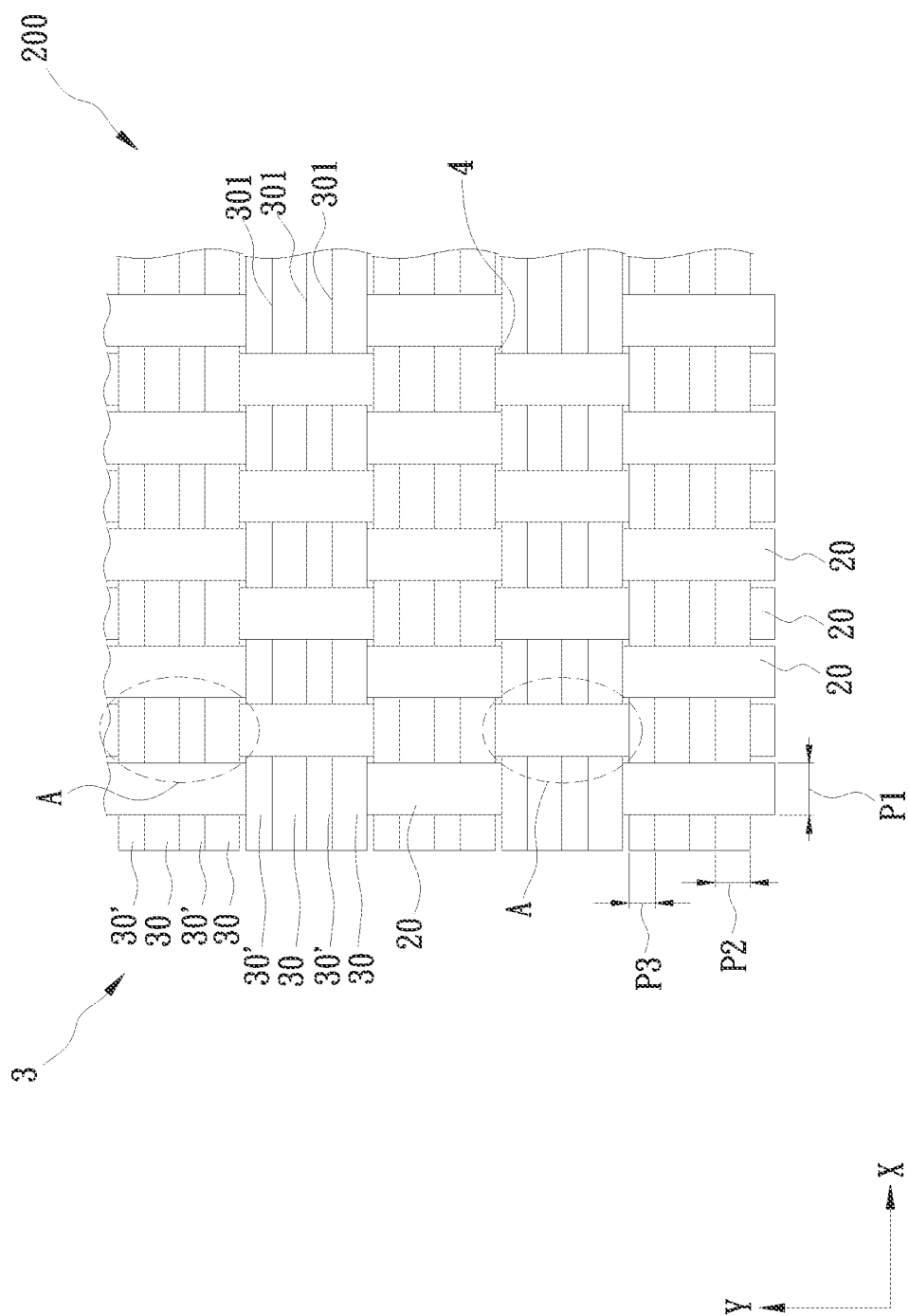
FIG. 2B is a top view of another embodiment of the capillary mesh woven structure of the present invention.

The capillary mesh woven structure 200 includes multiple longitudinal lines 20 and multiple latitudinal lines 30. In this embodiment, as shown in FIGS. 2A, 2B and 3, at least two latitudinal lines, that is, a first latitudinal line 30 and a second latitudinal line 30', are selectively arranged as a latitudinal line set 3. (The latitudinal line set 3 can alternatively selectively have more than two, such as three, four or more, latitudinal lines 30 in accordance with different application requirements). The first and second latitudinal lines 30, 30' of the latitudinal line set 3 have different diameters (thickness) and are tightly side-by-side arranged. The multiple latitudinal line sets 3 extend in a second weaving direction X (such as transverse direction), while the single longitudinal line 20 extend in a first weaving direction Y (such as longitudinal direction) to sequentially repeatedly intersect and overlap with the multiple latitudinal line sets 3, whereby the multiple latitudinal line sets 3 and the multiple longitudinal lines 20 are woven into the capillary mesh woven structure 200.

In addition, in the same weaving area, the first and second latitudinal lines 30, 30' of each latitudinal line set 3 respectively have a first latitudinal line diameter P2 and a second latitudinal line diameter P3, which are different from each other. The first latitudinal line diameter P2 is larger than the second latitudinal line diameter P3. Both the first latitudinal line diameter P2 and the second latitudinal line diameter P3 are smaller than the longitudinal line diameter P1 of each longitudinal line 20. Moreover, the longitudinal line diameter P1 of each longitudinal line 20 is larger than or equal to the sum of the first latitudinal line diameter P2 and the second latitudinal line diameter P3 of each latitudinal line set 3. Accordingly, the numbers of the first and second latitudinal lines 30, 30' with different thicknesses are increased to define numerous voids (gaps) t1, t1' with different sizes in the capillary mesh woven structure 200. Please further refer to FIGS. 2A and 3. To speak more specifically, the single longitudinal line 20 and the first and second latitudinal lines 30, 30' of the latitudinal line sets 3 with different thicknesses sequentially repeatedly intersect (and overlap with) each other and are woven with each other to form multiple intersection sections A. In each intersection section A, two voids (gaps) t1, t1' with different sizes are defined between the longitudinal line 20 and outer circumferences of the first and second latitudinal lines 30, 30' with different thicknesses. Accordingly, the capillary mesh woven structure 200 has numerous voids (gaps) t1, t1' with different sizes (as shown in FIG. 3) and the numbers of the voids (gaps) t1, t1' are increased. In addition, each two adjacent longitudinal lines 20 and the first and second latitudinal lines 30, 30' of each two adjacent latitudinal line sets 3 together define a mesh 4.

The longitudinal line 20 of the present invention has a longitudinal line diameter P1 and a circular cross section or a noncircular cross section (such as an elliptic cross section, a flat cross section, a beehive-shaped cross section or any other geometrical cross section).

The first and second latitudinal lines 30, 30' of each latitudinal line set 3 respectively have the first latitudinal line diameter P2 and the second latitudinal line diameter P3 different from each other. As shown in FIG. 3, (which is a left side view of the capillary mesh woven structure of the present invention according to FIG. 2A), the first and second latitudinal lines 30, 30' have the same or different cross-sectional configurations, for example, a larger circular cross section and a smaller circular cross section, or two noncircular cross sections or two cross sections with any other geometrical configuration. In addition, at least two flow-guiding micro-passages 301 are formed between the first and second latitudinal lines 30, 30' of each latitudinal line set 3. The two flow-guiding micro-passages 301 are respectively positioned above and under contact sections of the first and second latitudinal lines 30, 30' (as shown in FIG. 3) and extend in a lengthwise direction of the first and second latitudinal lines 30, 30'.

The longitudinal lines 20 and the first and second latitudinal lines 30, 30' can be made of a metal material or a nonmetal material (such as plastic or stone material) with a certain flexibility and good heat conductivity. That is, the longitudinal lines 20 and the first and second latitudinal lines 30, 30' can be made of the same material (or different materials) collocated with each other.

Further referring to FIGS. 1 and 4 and complementarily referring to FIGS. 2A, 2B and 3, an outer side of the lower plate 102 of the two-phase fluid heat dissipation unit 100 is attached to (in contact with) a heat source (such as a central processing unit or a graphics processing unit or any other electronic unit, not shown). An inner side of the lower plate 102 serves as an evaporation face 111, while an inner side of the upper plate 101 serves as a condensation face 112 opposite to the evaporation face 111. The capillary mesh woven structure 200 of the present invention can be selectively disposed on the evaporation face 111 or the condensation face 112. In this embodiment, the capillary mesh woven structure 200 is selectively disposed on the evaporation face 111. When the two-phase fluid heat dissipation unit 100 works, the lower plate 102 of the two-phase fluid heat dissipation unit 100 absorbs the heat of the heat source and the heat is transferred to the evaporation face 111, whereby the liquid working fluid on the evaporation face 111 is quickly evaporated into vapor working fluid, which quickly flows to the condensation face 112. After the condensation face 112 heat-exchanges with the external air, the vapor working fluid is again condensed into the liquid working fluid. Then, under gravity or the capillary attraction of the capillary structure, the liquid working fluid goes from the condensation face 112 back to the inner side of the lower plate 102. In the capillary mesh woven structure 200 of the present invention, the single longitudinal line 20 and the first and second latitudinal lines 30, 30' are collocated and woven with each other. The number of the longitudinal lines 20 is different from and in a certain proportion to the number of the first and second latitudinal lines 30, 30'. In addition, the diameter of the longitudinal lines 20 is different from the diameters of the first and second latitudinal lines 30, 30'. Therefore, the capillary mesh woven structure 200 has more voids (gaps) t1, t1' with different sizes and more flow-guiding micro-passages 301 for speeding the backflowing of the working fluid from the condensation face 112 to the evaporation face 111. In addition, the voids (gaps) t1, t1' and the flow-guiding micro-passages 301 of the capillary mesh woven structure 200 serve to directionally guide the working fluid to quickly spread over the evaporation face 111, whereby the evaporation face 111 has better water collection (containing) ability to avoid dry-out.

Accordingly, the rate of boiling and evaporation of the working fluid on the evaporation face 111 in response to the temperature is enhanced. Moreover, not only the condensed working fluid can quickly continuously flow from the condensation face 112 back to the evaporation face 111 to avoid dry-out, but also the next circulation between heat absorption and evaporation and heat release and condensation can be quickly performed. Therefore, the transformation between the liquid phase and the vapor phase of the working fluid is continuously circularly takes place to continuously transfer the heat. Accordingly, the circular transformation between the liquid phase and the vapor phase of the working fluid in the chamber 110 is effectively speeded to enhance the heat transfer efficiency for the high-temperature area of the heat source so as to promote the heat dissipation performance. Therefore, the two-phase fluid heat dissipation unit 100 can achieve very good heat spreading and heat dissipation effect.

In practice, the entire weaving section (area) or a local weaving section (area) of the capillary mesh woven structure 200 of the present invention is woven from the single longitudinal line 20 and one cooperative latitudinal line set 3. Numerous voids (gaps) t1, t1' are defined between the longitudinal lines 20 and the latitudinal line sets 3 to enhance the water collection (containing) ability and capillary action. Moreover, according to the requirement for enhancement of any or both of the water collection (containing) ability and capillary action, the diameter of the longitudinal lines 20 and the diameters of the first and second latitudinal lines 30, 30' of the latitudinal line sets 3 of the capillary mesh woven structure 200 can be adjusted so as to adjust the sizes of the voids (gaps) or adjust the intervals between the longitudinal line 20 and the longitudinal line 20 and/or the intervals between the first and second latitudinal lines 30, 30' so as to adjust the density between the longitudinal lines 20 and the latitudinal lines 30 (30'). In this case, the capillary mesh woven structure can be freely designed in accordance with different types of the two-phase fluid heat dissipation unit 100 (such as vapor chamber or heat pipe) to satisfy different heat dissipation requirements of the respective sections of the two-phase fluid heat dissipation unit 100.

Furthermore, the capillary mesh woven structure 200 arranged in the position where the heat source is positioned, (that is, the evaporation face 111), can be disposed on a section of the evaporation face 111 as one single block or disposed on multiple sections of the evaporation face 111 as multiple blocks or disposed over the entire evaporation face 111 in accordance with the distribution state of the high-temperature sections of the heat source.

Accordingly, the entire weaving section (area) of the capillary mesh woven structure 200 of the present invention is, but not limited to, formed of the single longitudinal lines 20 and one latitudinal line set 3 (having multiple latitudinal lines 30, 30' with different thicknesses), which are collocated and woven with each other. Alternatively, in a modified embodiment, only a local weaving section of the capillary mesh woven structure 200 is formed of the single longitudinal line 20 and one latitudinal line set 3 (having multiple latitudinal lines 30, 30' with different thicknesses), which are collocated and woven with each other, while the remaining section of the capillary mesh woven structure 200 is conventionally formed of the single longitudinal line 20 and the single latitudinal line 30 collocated and woven with each other. For example, the capillary mesh woven structure 200 has a heat source contact section positioned at the center of the capillary mesh woven structure 200 corresponding to a heat source and a peripheral section positioned around the heat source contact section. The heat source contact section is conventionally woven from the single longitudinal lines and the single latitudinal lines, which sequentially repeatedly intersect (and overlap with) each other, while the peripheral section is woven from the single longitudinal line 20 and one cooperative latitudinal line set 3 having multiple latitudinal lines with the same thickness or different thicknesses, which sequentially repeatedly intersect (and overlap with) each other. To speak more specifically, the heat source contact section of the capillary mesh woven structure 200 is disposed in the chamber 110 of the two-phase fluid heat dissipation unit 100 corresponding to the evaporation face 111 in contact with the heat source. After the liquid working fluid contained in the heat source contact section of the capillary mesh woven structure 200 is heated, the liquid working fluid is quickly evaporated into the vapor working fluid. The peripheral section of the capillary mesh woven structure 200 has greater capillary attraction and better water collection (containing) ability so that the condensed working fluid can more quickly flow back to the peripheral section around the heat source contact section. Accordingly, the liquid working fluid can be collected (and contained) in the peripheral section and supplied to the heat source contact section at a proper time to avoid dry-out of the evaporation face 111.

Alternatively, as necessary, any of the heat source contact section and the peripheral section of the capillary mesh woven structure 200 of the present invention can be formed of the single longitudinal line 20 and one latitudinal line set 3 collocated and woven with each other.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A capillary mesh woven structure applied to and disposed in a two-phase fluid heat dissipation unit, the capillary mesh woven structure comprising:
    a longitudinal line extending in a first weaving direction; and
    a corresponding latitudinal line set extending in a second weaving direction and having at least two latitudinal lines each with different line diameters and extending side-by-side and parallel each other, wherein the longitudinal line and the corresponding latitudinal line set sequentially repeatedly intersect and overlap with each other and are collocated and woven with each other to form the capillary mesh woven structure,
    wherein the longitudinal line has a line diameter that is equal to or greater than a sum of the different line diameters of the latitudinal lines of the latitudinal line set,
    wherein the intersection and overlapping of the longitudinal line and the latitudinal line set having at least two latitudinal lines with different diameters forms voids with different sizes in the capillary mesh structure to enhance capillary attraction and water collection ability.

2. The capillary mesh woven structure as claimed in claim 1, wherein at least one of the latitudinal lines of the latitudinal line set has a circular cross section.

3. The capillary mesh woven structure as claimed in claim 1, wherein the longitudinal line has a circular cross section.

4. The capillary mesh woven structure as claimed in claim 1, wherein the longitudinal line and the latitudinal line set are made of metal material.

5. The capillary mesh woven structure as claimed in claim 1, wherein the capillary mesh woven structure is disposed in a two-phase fluid heat dissipation unit, the two-phase fluid heat dissipation unit including an upper plate and a lower plate, the upper plate being mated with the lower plate to together define a chamber, in which a working fluid is filled, the capillary mesh woven structure being disposed on an inner side of the lower plate of chamber.

6. The capillary mesh woven structure as claimed in claim 5, wherein the two-phase fluid heat dissipation unit is a vapor chamber.

* * * * *